United States Patent
Nozuyama

(10) Patent No.: US 6,834,368 B2
(45) Date of Patent: Dec. 21, 2004

(54) SEMICONDUCTOR INTEGRATED CIRCUIT INCLUDING A TEST FACILITATION CIRCUIT FOR FUNCTIONAL BLOCKS INTELLECTUAL PROPERTIES AND AUTOMATIC INSERTION METHOD OF THE SAME TEST FACILITATION CIRCUIT

(75) Inventor: Yasuyuki Nozuyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 09/960,414

(22) Filed: Sep. 24, 2001

(65) Prior Publication Data

US 2002/0059547 A1 May 16, 2002

(30) Foreign Application Priority Data

Sep. 25, 2000 (JP) .................................... P2000-290717

(51) Int. Cl.$^7$ .............................................. G01R 31/28
(52) U.S. Cl. ........................................ 714/738; 714/732
(58) Field of Search ............................... 714/724, 726, 714/729, 732, 733, 734, 738, 739

(56) References Cited

U.S. PATENT DOCUMENTS 5,051,996 A * 9/1991 Bergeson et al. ........... 714/732
5,184,067 A * 2/1993 Nozuyama ................. 324/73.1
5,677,916 A   10/1997 Nozuyama ................. 714/733
6,021,514 A * 2/2000 Koprowski ................. 714/733
6,553,530 B1 * 4/2003 Kim ........................... 714/738

FOREIGN PATENT DOCUMENTS

| JP | 62-55955 | 3/1987 |
| JP | 62-115380 | 5/1987 |
| JP | 2-22579 | 1/1990 |
| JP | 2-77849 | 3/1990 |
| JP | 5-180903 | 7/1993 |
| JP | 6-130134 | 5/1994 |
| JP | 7-248904 | 9/1995 |
| JP | 11-006869 | 1/1999 |
| JP | 11242900 | 9/1999 |
| KR | 1020000013809 | 3/2000 |

* cited by examiner

Primary Examiner—Christine T. Tu
(74) Attorney, Agent, or Firm—Finnegan, Henderson, Farabow, Garrett & Dunner, L.L.P.

(57) ABSTRACT

This invention provides a semiconductor integrated circuit in which test facilitation technology (design for testability) of system on a chip (SOC) constructed of functional blocks or intellectual properties (IPs) is improved. This semiconductor integrated circuit takes out a test result of the functional block out of the SOC through a test result storage circuit which signature-compresses the test result.

14 Claims, 14 Drawing Sheets

FIG.9

| A | B | SEL 1 | SEL 0 | A1 | A2 | A3 | ACTION |
|---|---|---|---|---|---|---|---|
| 0 | 0 | — | — | 0 | 0 | 0 | RESET (0 IS INPUTTED TO ALL FLIP-FLOPS) |
| 0 | 1 | — | — | 0 | 0 | 0 | SERIAL ACTION (TEST RESULT IS OUTPUTTED SERIALLY FROM SO) |
| 1 | 0 | — | — | 1 | 1 | 1 | TEST DATA CAPTURE |
| 1 | 1 | 0 | 0 | 1 | 0 | 0 | OUTPUT OF IP71 UNDERGOES SIGNATURE COMPRESSION |
| 1 | 1 | 0 | 1 | 0 | 1 | 0 | OUTPUT OF IP72 UNDERGOES SIGNATURE COMPRESSION |
| 1 | 1 | 1 | 0 | 0 | 0 | 1 | OUTPUT OF IP73 UNDERGOES SIGNATURE COMPRESSION |

FIG.14

| RST | SHIFT | SEL 1 | SEL 0 | IP 1_SEL | IP 2_SEL | IP 3_SEL | ACTION |
|---|---|---|---|---|---|---|---|
| 0 | — | — | — | — | — | — | RESET (0 IS INPUTTED TO ALL FLIP-FLOPS) |
| 1 | 1 | — | — | 0 | 0 | 0 | SERIAL ACTION (TEST RESULT IS OUTPUTTED SERIALLY FROM SO) |
| 1 | 0 | 0 | 0 | 1 | 0 | 0 | OUTPUT OF IP71 UNDERGOES SIGNATURE COMPRESSION |
| 1 | 0 | 0 | 1 | 0 | 1 | 0 | OUTPUT OF IP72 UNDERGOES SIGNATURE COMPRESSION |
| 1 | 0 | 1 | 0 | 0 | 0 | 1 | OUTPUT OF IP73 UNDERGOES SIGNATURE COMPRESSION |

SEMICONDUCTOR INTEGRATED CIRCUIT INCLUDING A TEST FACILITATION CIRCUIT FOR FUNCTIONAL BLOCKS INTELLECTUAL PROPERTIES AND AUTOMATIC INSERTION METHOD OF THE SAME TEST FACILITATION CIRCUIT

CROSS REFERENCE TO RELATED ART

This application claims benefit of priority under 35USC 119 based on Japanese Patent Application No. P2000-290717, filed on Sep. 25, 2000, the entire contents of which are incorporated by reference herein.

BACKGROUND OF THE INVENTION

1. Field of the Invention

The present invention relates to a semiconductor integrated circuit in which test facilitation technology for system on a chip (SOC) constructed with functional blocks (IP: intellectual property) is improved and an automatic insertion method of the same test facilitation circuit. Particularly the present invention relates to a semiconductor integrated circuit in which an effective, high-quality test on the functional blocks (IPs) provided inside the SOC having few outer terminals is achieved and an automatic insertion method of the same test facilitation circuit.

2. Description of the Related Art

In recent years, a large scale LSI called system on a chip (SOC) has been developed, the SOC including an entire single system. For the SOC, a design technique of integrating the IPs, which are functional blocks for achieving a specified function, has become important. In a test on the SOC, a design method for facilitating a test (design for testability: DFT) on the IPs has been employed. The basic DFT method for the IP in the SOC is classified to two types as follows.

(1) Parallel access insertion (MUX (multiplexer) insertion)
(2) Serial access insertion The method (1) is capable of controlling directly and observing I/O terminals of the IP in the SOC from outside the SOC through the MUXes. A test pattern (test patterns) can be produced easily by making values about the I/O terminals of an object IP possible to monitor in a logic simulation for the SOC.

FIG. 1 shows the structure of the SOC employing the MUX insertion method, which is according to the prior art. In FIG. 1, an IP 142, which is a test object, exists in an SOC 141. A MUX array 144 is provided between input terminals of an IP 142 and connecting wires from a functional block 143 (logic 1 in FIG. 1, which may be an IP) for ordinary operation. A wire from an input terminal array T11 of the SOC 141 is connected to another input of the MUX array 144. Upon test on the IP 142, a selection signal (generally, input signal to the SOC 141, not shown) to this MUX array 144 selects test data from the input terminal array T11 of the SOC 141, so that data can be applied directly to the IP 142 from outside the SOC 141.

An output from the IP142 is branched at an appropriate position ahead of the functional block 145 (logic 2 in FIG. 1), which is an output object and may be an IP. The branched output is connected to an input of the MUX array 146 controlled according to the same selection signal as the input to the IP 142. The MUX array 146 is provided in a connection wiring between the appropriate functional block 145 in the SOC 141 and an output terminal (output circuit) array T12 of the SOC 141. Upon test on the IP 142, the MUX array 146 can select an output from the IP 142, so that the output from the IP 142 can be observed outside the SOC 141.

As for the bi-directional signal terminal of the IP 142, a bi-directional MUX array (generally, composed of bus) 147 is provided between the functional blocks 143, 144 for the normal operation and the bi-directional signal terminal (circuit) array T13. Upon the test time, the bi-directional signal terminals of the IP 142 and the bi-directional signal terminals of the array T13 are enabled to exchange signals according to a selection signal used in the above-described two types of the MUX arrays 144, 146. In order to prevent a conflict of signals on the MUX array 147, a signal (not shown) for determining a signal direction, that is, input to or output from the IP 142, is employed. Consequently, the bi-directional signal terminals of the SOC 141 can be operated as if it is a bi-directional signal terminals of the IP 142. According to the MUX insertion method, the IP 142 in the SOC 141 is tested under the above described system.

On the other hand, in the above described (2), a scan test method is employed basically inside the IP 142 so as to produce a test pattern (test patterns) by automatic test pattern generation (ATPG). The input/output terminals of the IP 142 are provided with F/Fs (flip-flops) corresponding to each terminal, called wrapper, which are connected in series and by inputting a predetermined test pattern successively from outside the SOC 141, its result is observed outside the SOC 141.

Of these methods according to the prior art, the MUX insertion method described in the above (1), although its fault coverage (fault detection rate) is slightly lower as compared to the above described (2) method, accompanies only a slight increase in area of the structure necessary for carrying out a test, and can keep a test execution frequency high. On the other hand, if the number of external terminals of the SOC 141 is smaller than that of the external terminals of the IP 142, this method cannot be applied, so that there is no way but applying the above described (2) method.

As described above, as for the MUX insertion method, which is one of the conventional methods for testing the SOC having the IPs, the structure necessary for the test is small and its test time is short. However, contrary to this, if the number of the external terminals of the SOC is smaller than that of the external terminals of the IP, this method cannot be carried out. On the other hand, although as for the other conventional serial access method, its fault coverage is higher as compared to the above-described MUX insertion method, the structure necessary for the test is enlarged and its test time is prolonged.

BRIEF SUMMARY OF THE INVENTION

According to one aspect of the present invention, there is provided a semiconductor integrated circuit having plural functional blocks (IPs; Intellectual Properties) connected to each other, the semiconductor integrated circuit comprising a selection circuit, a bi-directional selection circuit, the functional block (IP), and a test result storage circuit. The selection circuit selects any one of plural inputs and outputting. The bi-directional selection circuit exchanges data bi-directionally. The functional block (IP) includes an input terminal connected to an output terminal of another functional block (which may be an IP) and an input terminal of the semiconductor integrated circuit through the selection circuit and a bi-directional terminal connected to the bi-directional terminal of another functional block and a bi-directional terminal of the semiconductor integrated circuit through the bi-directional selection circuit. The test result storage circuit functions as a test facilitation circuit such that it is connected to an output terminal of the functional block (IP) which receives test outputs of plural bits (n) in parallel from the functional block (IP), compresses the test output into a signature, and outputs the signature-compressed data from an output terminal of the semiconductor integrated circuit in the unit of m (m<n) bits which is smaller than the plural (n) bits.

According to another aspect of the present invention, there is provided an automatic insertion method of a test facilitation circuit for inserting the test facilitation circuit into a semiconductor integrated circuit constructed by connecting plural functional blocks (IPs) to each other, the automatic insertion method comprising: inputting relating data of the semiconductor integrated circuit including net data indicating input/output terminal of the semiconductor integrated circuit, input/output terminal available for test for the functional block (IP), input/output terminal of the functional block (IP) which realizes the function of the semiconductor integrated circuit and internal connection of the input/output terminal of the semiconductor integrated circuit and a test pattern (test patterns) for confirming the operation of the semiconductor integrated circuit and relating data of the functional block (IP) including the input/output terminal of the functional block (IP), information describing an operation for realizing the functional block (IP) function, kind of the test facilitation method for checking whether or not there is a problem and a test pattern (test patterns) prepared according to the method; inserting a test result storage circuit which functions as the test facilitation circuit for the functional block (IP) which is a test object into the semiconductor integrated circuit based on the input; and outputting relating information after the insertion of the test facilitation circuit of the semiconductor integrated circuit, including net data of the semiconductor integrated circuit in which the test facilitation circuit is inserted and a test pattern (test patterns) obtained by converting a test pattern (test patterns) of the functional block (IP) so as to be capable of being used in the semiconductor integrated circuit in which the test facilitation circuit is inserted.

BRIEF DESCRIPTION OF THE SEVERAL VIEWS OF THE DRAWINGS

FIG. 9 is a table showing input/output of a test decoding circuit shown in FIG. 8 and a test result storage circuit;

FIG. 14 is a table showing input/output of the test decoding circuit shown in FIG. 11 and an operation of the test result storage circuit.

DETAILED DESCRIPTION OF THE INVENTION

Figure 1:
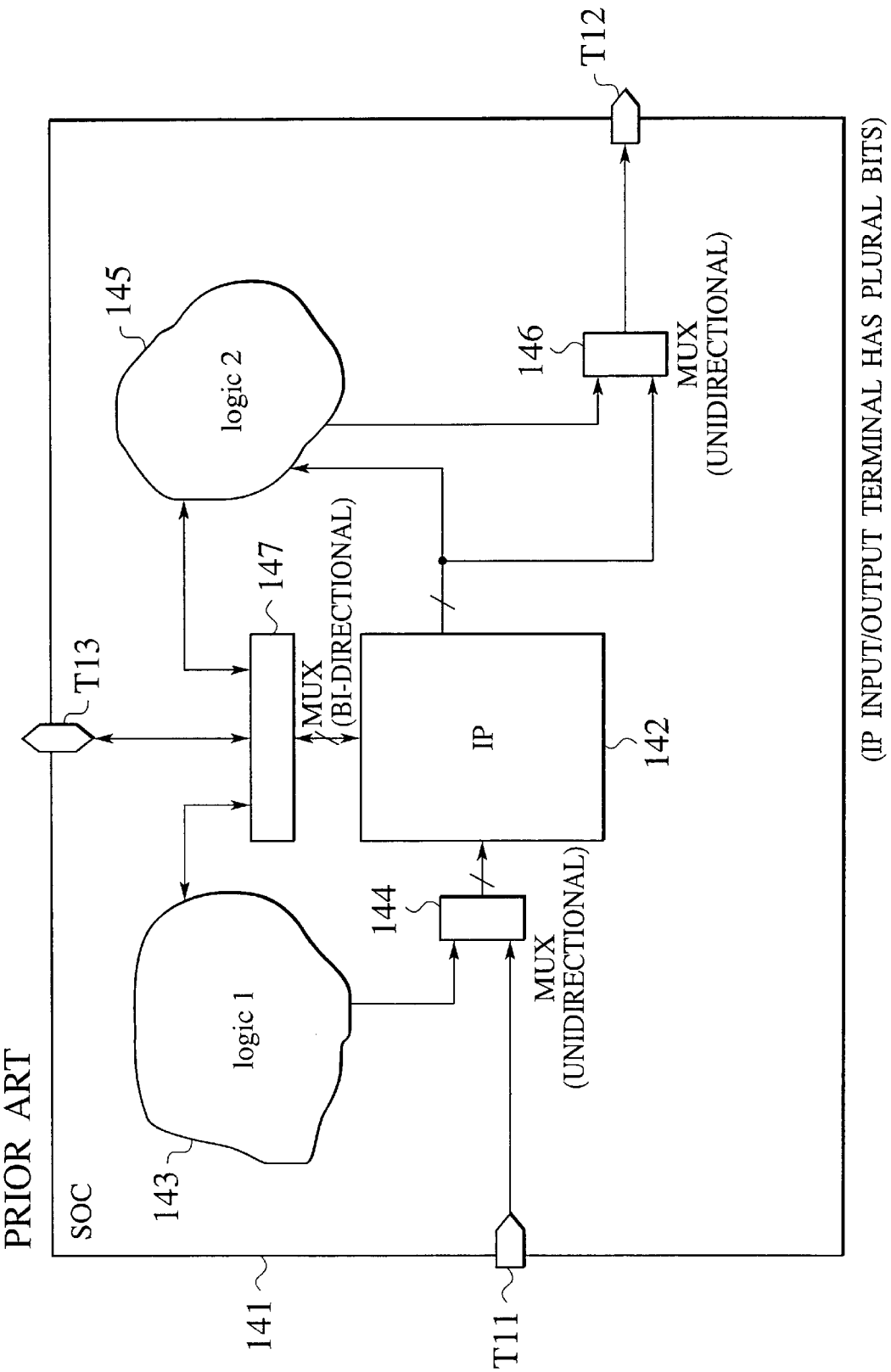
FIG. 1 is a diagram showing the structure of a semiconductor integrated circuit including a test MUXes according to the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 2:
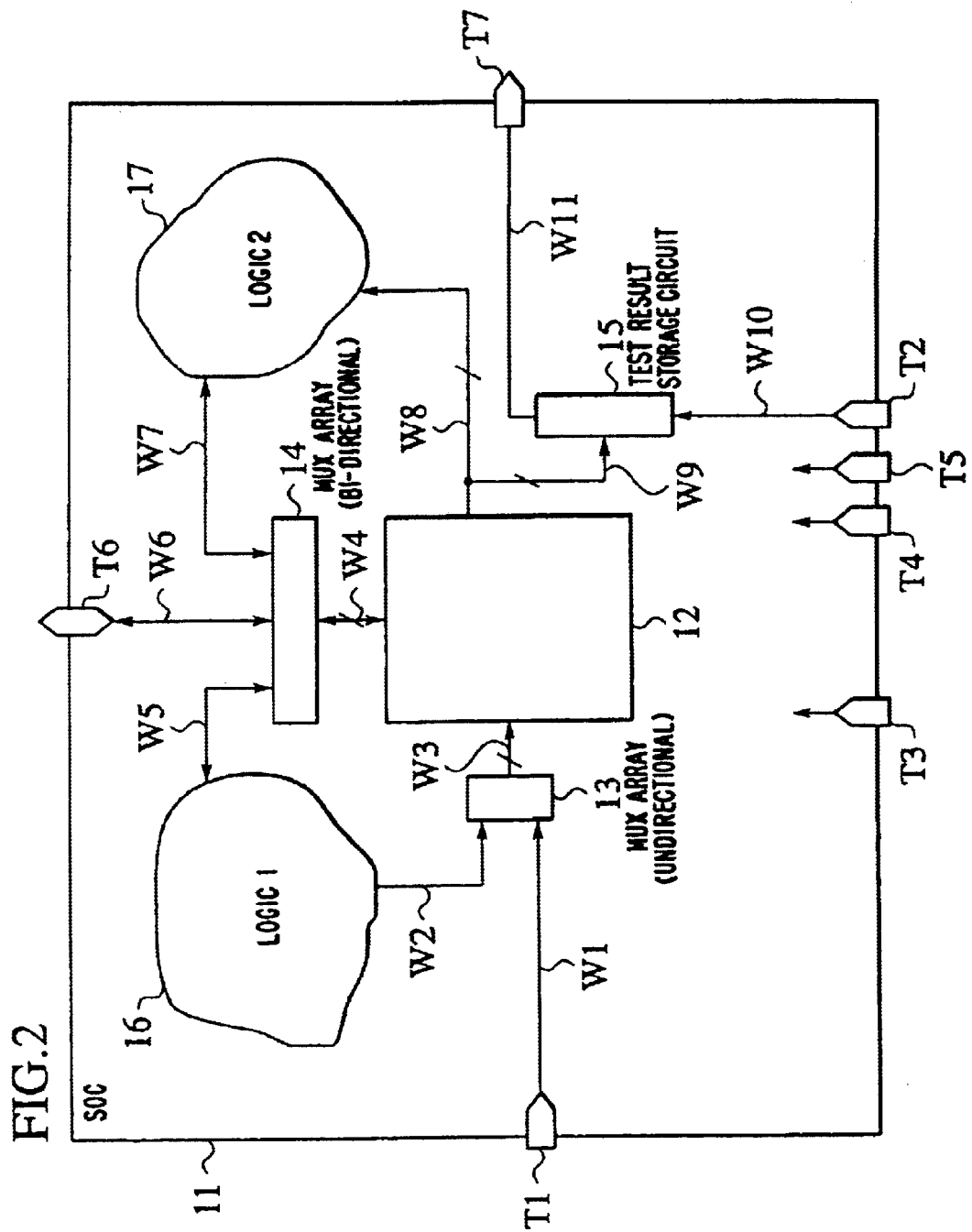
FIG. 2 is a block diagram showing the structure of a semiconductor integrated circuit according to a first embodiment of the present invention.

FIG. 2 is a diagram showing the structure of a semiconductor integrated circuit according to a first embodiment of the present invention. The semiconductor integrated circuit of the first embodiment contains an IP 12, which is a test object under a test system which is a feature of this embodiment, inside a SOC 11 like the structure shown in FIG. 1. Generally, because the plural copies of an IP are used inside the SOC, they are distinguished individually inside the SOC by calling each of them "instance". However, in order to stress a point that the IP is employed inside the SOC, the expression "IP" will be used (this is the same for other embodiments described below). If the copies of an IP are used inside the SOC, "different IP" mentioned in the embodiment except such a non-essential point that their IP data to be referred to is equal only should be read to be "different instances of the same IP" and the content of the present invention can be applied without any problem to a case where the SOC contains the plural copies of an IP.

Referring to FIG. 2, as the structure for carrying out a test, the SOC 11 contains a MUX array 13, a bi-directional MUX array 14 and a test result storage circuit 15. Further, the SOC 11 includes input terminal arrays T1, T2, a test mode input terminal T3, control input terminals T4, T5, a bi-directional terminal circuit array T6 and an output terminal circuit T7, which are connected with wires. Input terminals of the input terminal array T1 are connected to inputs of the MUX array 13 through wire W1. Outputs of a logical block 16 are connected to the other inputs of the MUX array 13 through wires W2. Outputs of the MUX array 13 are connected to inputs of the IP 12 through wires W3.

The IP 12 and the logical block 16 are connected to each other bi-directionally through the bi-directional MUX array 14 with wires W4, W5. Then, the IP12 and the bi-directional terminal circuit array T6 are connected to each other through a bi-directional MUX array 14 with wires W4, W6. The IP12 and the logical block 17 are connected to each other through a bi-directional MUX array 14 with wires W4, W7.

Output terminals (Outputs) of the IP 12 are connected to the logical block 17 through wires W8 and to a test result storage circuit 15 through wires W9. The test result storage circuit 15 is connected to an input terminal T2 through wire W10 and to an output terminal circuit T7 through wire W11. Plural-bit data is transmitted through the wires W1 to W9 and 1-bit data is transmitted through wires W10, W11.

Although input terminals T3, T4, T5 may be used as a dedicated terminal for test for the IP 12, they may be shared with terminals for use at normal operation time of the SOC 11 by appropriate logical device.

With such a structure, at the normal operation when the SOC 11 carries out its own proper functional operation or test mode signal (TEST)=0, the IP 12 receives signals from the logical block 16. Further, its outputs are supplied to the logical block 17. The IP 12 exchanges bi-directional data with the logical blocks 16, 17. On the other hand, when TEST=1, test condition arises. Hereinafter, the structures of the MUX array 13, bi-directional MUX array 14 and test result storage circuit 15 will be described with an operation of the structure shown in FIG. 2 (and FIG. 1).

Figure 3:
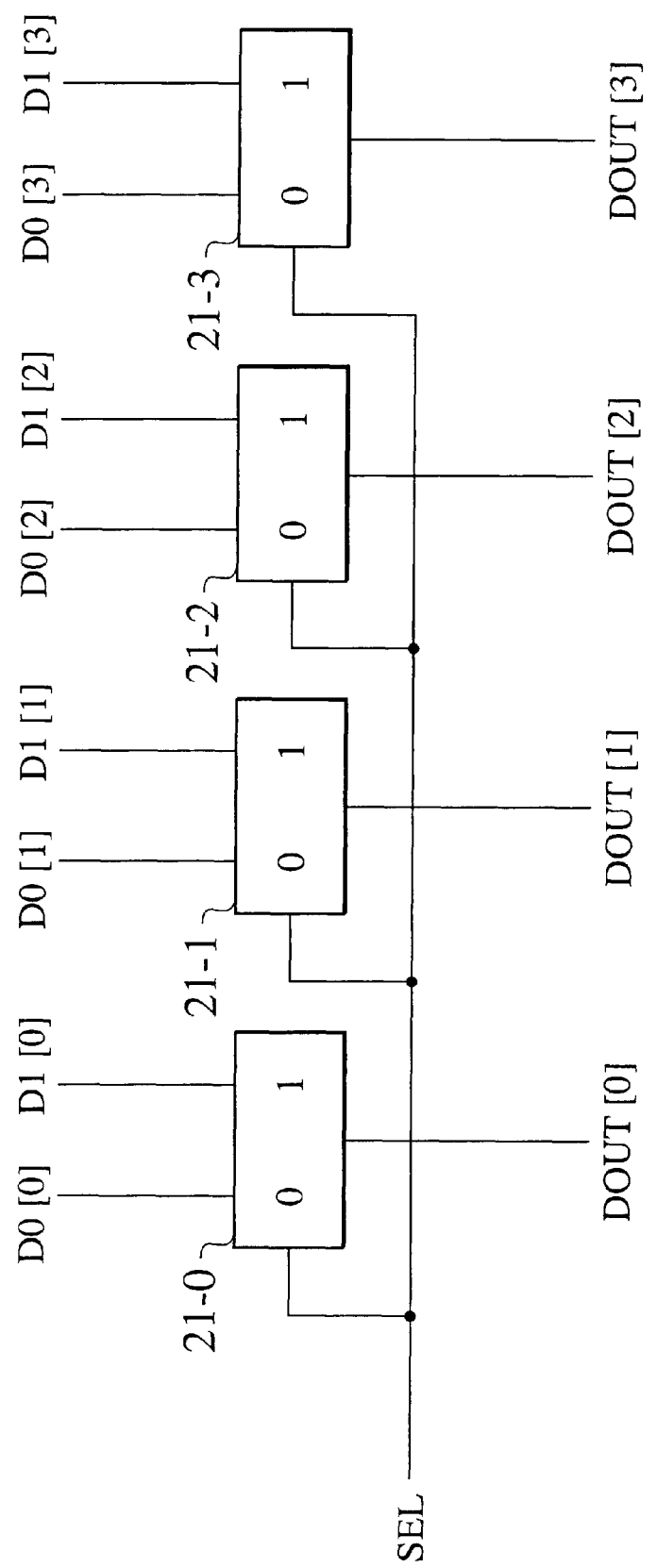
FIG. 3 is a block diagram showing a detailed structure of the MUX array shown in FIG. 1 and FIG. 2.

FIG. 3 is a diagram showing the structure of the MUX array shown in FIG. 2 (and FIG. 1). The structure shown in FIG. 3 indicates an example of the structure in which the MUX array 13 has, for example, 4-bit width. Referring to FIG. 3, the MUX array 13 comprises four MUXs 21-0 to 21-3 each having two inputs and an output, those MUXs being disposed in parallel to each other. The MUX 21-0 to 21-3 select input D0[0]-D0[3] on "0" side when the selection signal SEL=0. When SEL=1, input D1[0]-D1[3] on "1" side are selected. If speaking about the relation with FIG. 1, if the selection signal SEL=TEST is assumed, it comes that the wires W2 are connected to D0[0]-D0[3], the wires W1 are connected to D1[0]-D1[3 ] and the wires W3 are connected to DOUT [0]-DOUT [3 ]. When TEST=0, the IP 12 carries out normal operation for receiving inputs from the logical block 16. When TEST=1, it comes that the IP 12 carries out test operation for receiving test input data through the input terminal array T1 of the SOC 11.

Figure 4:
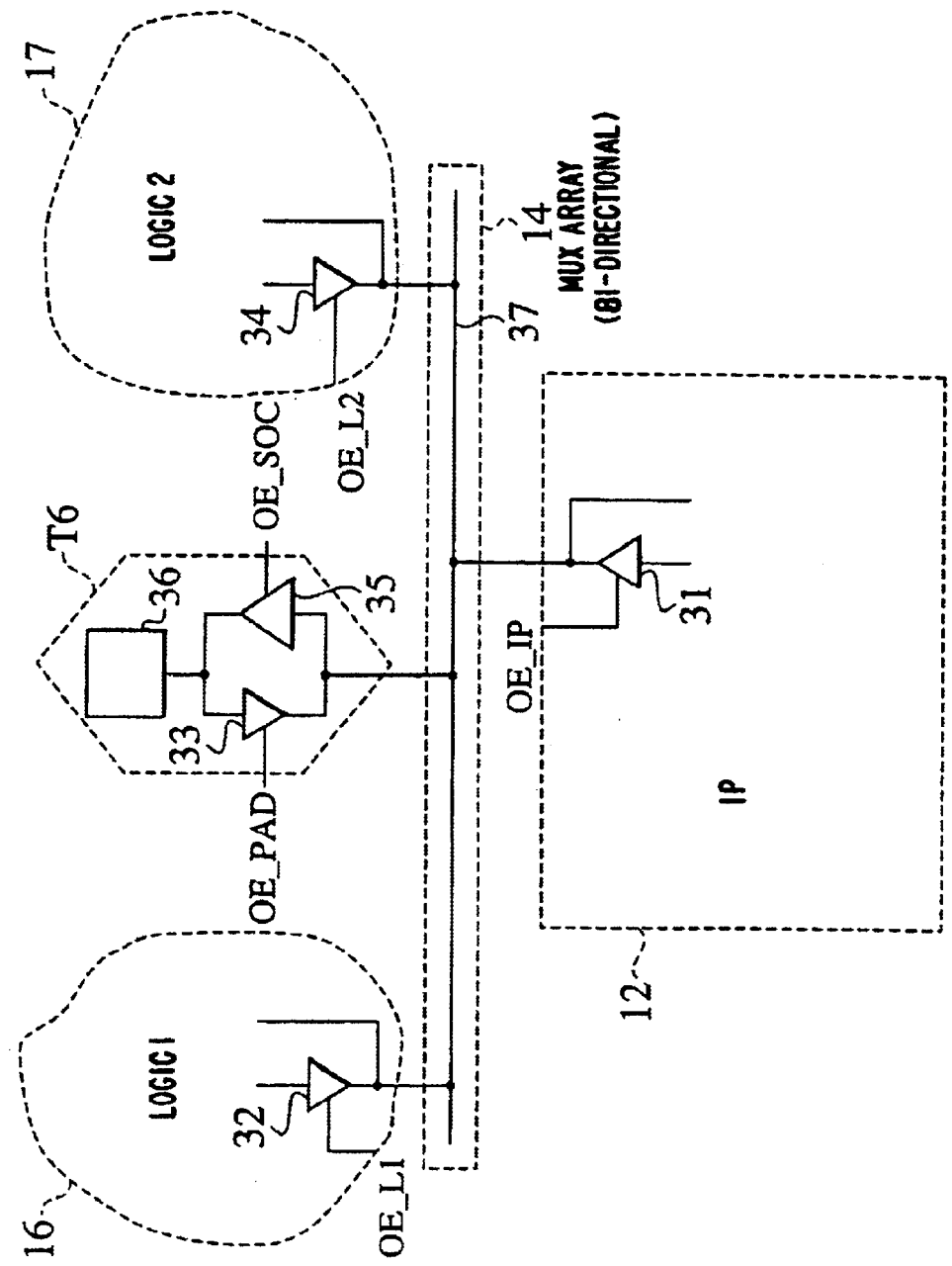
FIG. 4 is a block diagram showing the detailed structure of bi-directional MUX array shown in FIG. 1 and FIG. 2.

FIG. 4 is a diagram showing the structure of a bit of the bi-directional MUX array 14 shown in FIG. 2 (and FIG. 1). The structure of other bit is the same as that shown in FIG. 4. The bi-directional MUX array 14 is achieved with bi-directional signal bus. In this case, an internal structure of a bit of the MUX array 14 contains only common wire 37 and connection nodes. Outputs of respective 3-state buffers 31, 32, 33, 34, provided in the IP 12, the logical blocks 16, 17, and inputs to these blocks, and the bi-directional terminal circuit T6 indicated with dotted lines in FIG. 4, respectively, are connected to this common wire 37. Further, this common wire 37 is connected to the IP 12 and the logical blocks 16, 17 so as to be capable of carrying out the mutual data exchange. When OE signal (OE_IP, OE_L1, OE_L2, OE_PAD, OE_SOC) is "1", the 3-state buffer acts as an ordinary buffer. When the OE signal is "0", high impedance state arises, so that in any case of the normal operation or test operation, only one of the 3-state buffers connected with the output to the common wire 37 in the MUX array 14 outputs a value not of high impedance (that is, OE signal=1).

Upon the test operation of the IP 12, data exchange between the SOC 11 and outside is carried out on a restriction condition that the OE signals of OE_PAD/OE_IP and OE_PAD/OE_SOC do not turn to "1" at the same time. Data input into the IP 12 from outside the SOC 11 is achieved under OE_PAD=1, OE_SOC=0, OE_IP=0, OE_L1=0, OE_L2=0. Data output from the IP 12 to outside of the SOC 11 is carried out under OE_PAD=0, OE_SOC=1, OE_IP=1, OE_L1=0, OE_L2=0. Although a logical circuit for such test control is not indicated here because this is complicated, it is necessary for carrying out a test operation relating to bi-directional signal of the IP 12 from outside the SOC 11.

Figure 5:
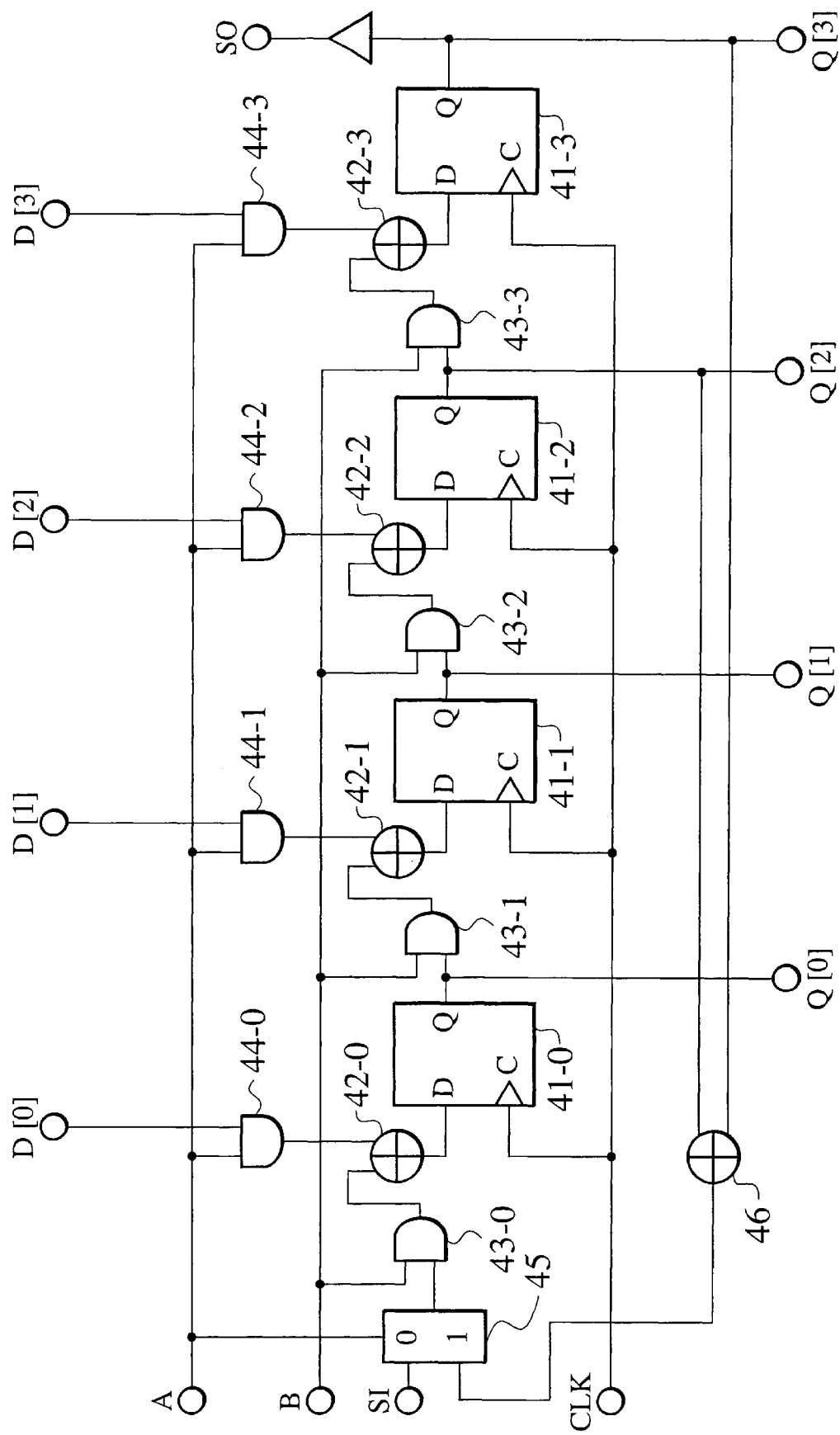
FIG. 5 is a circuit diagram showing the detailed structure of a test result storage circuit shown in FIG. 2.

FIG. 5 is a diagram showing the structure of a test result storage circuit 15 shown in FIG. 2. The test result storage circuit 15 shown in FIG. 5 outputs each bit in series by receiving a test result of four bits. Meanwhile, the bit count of the input/output is not restricted to this, this is set up appropriately depending on an output of the IP 12 which is an input of the test result storage circuit 15 and the quantity of the output terminal circuits T7 of the SOC 11 which is supplied with an output of the test result storage circuit 15. An output bit count (m) of the test result storage circuit 15 is set up to be at least fewer than an input bit count (n) (m<n).

Referring to FIG. 5, the test result storage circuit 15 comprises four flip-flop circuits (F/F) 41-0 to 41-3, four exclusive OR (EX-OR) gates 42-0 to 42-3, and four AND gates 43-0 to 43-3, and four AND gates 44-0 to 44-3 according to respective bit of the four-bit test result and MUX 45 and EX-OR gate 46. An output of the EX-OR gate 42 is connected to D input of the F/F 41 which operates synchronously with a clock signal (CLK). An input of the AND gate 43 on a next stage is connected to output Q of the F/F 41 excluding output Q of the F/F 41-3. An output of the AND gate 44 is connected to an input of the EX-OR gate 42 while an output of the AND gate 43 is connected to the other input. A control input terminal T5 is connected to an input of the AND gate 43. A control input terminal T4 is connected to an input of the AND gate 44 while test results D[0 ]-D[3 ] corresponding to the IP 12 are given to the other input through wires W9. The input terminal T2 is connected to an input (SI) of the MUX 45 through wire W10 while an output of the EX-OR gate 46 is connected to the other input. An output of the MUX 45 is connected to the other input of the AND gate 43-0. The output Q of the F/F 41-2 is connected to an input of the EX-OR gate 46 while the output Q of the F/F 41-3 is connected to the other input. The output Q of the F/F 41-3 is connected to the output terminal circuit T7 through a terminal SO with wire W11.

The test result storage circuit 15 having such a structure is controlled as follows based on a control signal A given to a control input terminal T4 and a control signal B given to a control input terminal T5.

| A | B | operation |
|---|---|-----------|
| 0 | 0 | reset (0 is inputted to all flip-flops) |
| 0 | 1 | serial operation |
| 1 | 0 | capture action of test data (normal operation) |
| 1 | 1 | signature compression action |

Hereinafter, the above-described operations will be described about bit 1 (D[1]) of FIG. 5. When A=0, B=0, the outputs of the AND gates 44-1, 43-1 are 0 and therefore, the output of the EX-OR gate 42-1 becomes 0, so that 0 is inputted to all the F/F41 including the F/F 41-1 so as to execute reset operation.

When A=0, B=1, SI data is selected as an input to the MUX 45. An output of the EX-OR gate 42-1 becomes the same as an output of the AND gate 43-1 (output of the F/F41-0 on a preceding stage), so that it comes that entirely the four F/F41 are connected serially. A serial action synchronous with a clock signal (CLK) occurs.

When A=1, B=0, a value of the test result D[1] is stored in the F/F41-1 and if seen entirely, an action for capturing the output of the IP 12 occurs.

When A=1, B=1, exclusive OR between the test result D[1] and the output of the F/F41-0 on the preceding stage is obtained by the EX-OR gate 42-1 and its exclusive OR value is stored in the F/F41-1. On the other hand, exclusive OR between an output of the F/F41-2 and an output of the F/F41-3 is obtained by the EX-OR gate 46. Its exclusive OR value is selected by the MUX 45. Exclusive OR between the selected exclusive OR value and the test result D[0] is obtained by the EX-OR gate 42 and its exclusive OR value is stored in the F/F41-0. As a result of such an operation, the test result storage circuit 15 functions as a signature compression register so as to carry out signature compression action. This action generates pseudo random numbered data in the F/F41 with data in the F/F41 and a newly applied output of the IP 12. After the test of the IP 12 is terminated, as a test result of the IP 12, inherent data of time series of the output data from the IP 12 is stored in the F/F41.

A test on the IP 12 is carried out under test mode signal TEST=1. For the output of the IP 12, the control signals A, B needs to be controlled. First, before with TEST=1, initial data to be observed is outputted from the IP 12, the inside of the F/F41 is reset to 0 under A=0, B=0. With A=1, B=1 in this state, all effective outputs from the IP 12 are subjected to signature compression. After the test of the IP 12 is terminated, serial operation is carried out on the F/F 41 under A=0, B=1. Then, a value obtained by subjecting the test result to the signature compression is read out successively from the output terminal circuit T7 of the SOC 11 out of the SOC 11 through the wire W11 and compared with an expected value in a normal circuit so as to determined whether or not a fault occurs. This reading can be accomplished by other various logical methods as well as handling of a test mode signal.

Meanwhile, if A=1, B=0 is assumed, an output from the IP 12 can be directly stored in the F/F41. For capturing the outputs from the IP 12 in the SOC 11 under normal operation, it is desirable that the control input terminals T4, T5 and the output terminal circuit T7 serves as dedicated terminals of the SOC 11. It is set at A=0, B=0 from the beginning. After data from the IP 12 in the normal operation under A=1, B=0 is stored in any cycle upon the normal operation, data stored in the F/F 41 under A=0, B=1 is outputted serially from the output terminal circuit T7 of the SOC 11. Consequently, the operation of the IP 12 can be diagnosed.

And, it is also possible to the IP 12, by realizing a reset condition by serially inputting 0, while it is made to be A=0 and B=1, and the input terminal T2=0 of the SOC 11, then by the setting to A=0, B=1 to go through the output terminal circuit T7, after the data is stored from IP12 by the setting to A=1, B=0. However, the input terminal T2 is not an indispensable matter in the first embodiment, and it is also possible to be removed. In addition, an output of EX-OR gate 46 may be directly connected for one of the input of AND gate 43 except for MUX 45 (in this case, the input SI becomes unnecessary).

The test result storage circuit 15 achieves its central function by its action as a multiple input signature resister (MISR). Probability that although a test result different from a normal case is outputted because of a fault existing inside the IP 12, a final test result becomes the same as the normal operation is $\frac{1}{2}^n$ (n is the number of bits of F/F41 ). If the number of outputs of the IP 12 is small in actual implementation, it is necessary to make such a treatment so that at least n>20 is attained. Further, since a feedback circuit (position of bit which should be fed back) of the signature compression register changes depending on the bit count, it is necessary to take this into account.

As described above, in the first embodiment, the output of the IP 12 does not have to be read out directly using the output terminal of the SOC 11. Thus, a test on the IP 12 having a number of output terminals can be carried out in the SOC having a relatively small number of the output terminals. Additionally, as compared to the serial access method according to the prior art, increase of area of a structure necessary for the test is suppressed and further, the test time can be reduced.

Figure 6:
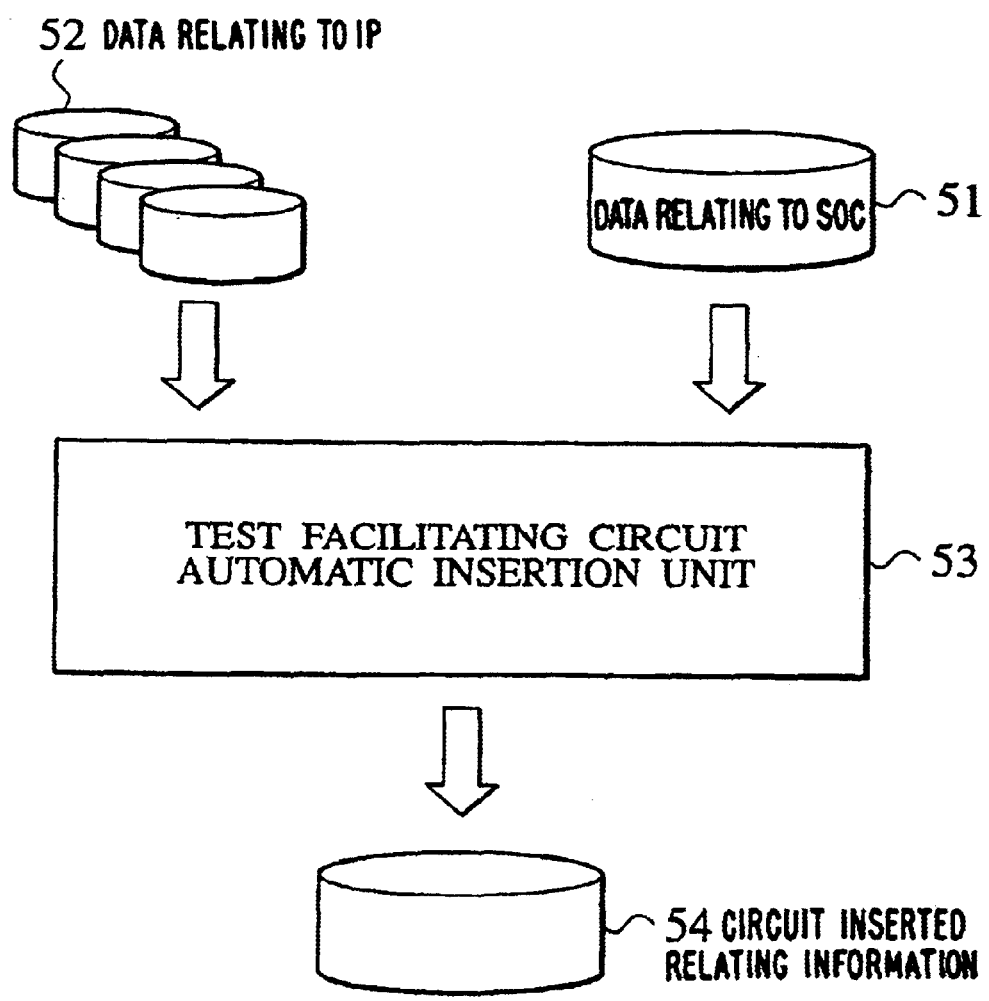
FIG. 6 is a block diagram for explaining automatic insertion of a test facilitation circuit according to the first embodiment of the present invention.

FIG. 6 shows a method for automatically inserting the test facilitation circuit of the first embodiment into the SOC. Relating data 51 to the SOC 11 and relating data 52 of IPs (generally, plural) including the IP 12 are inputted to a test facilitation circuit automatic insertion unit 53.

Here, the relating data to the SOC 11 includes (1) I/O terminals of the SOC 11, I/O terminals of the SOC 11 available for test of the IP 12 and other IPs, and net data (the top hierarchy network data) indicating concrete connection inside the SOC 11 about I/O terminals of the SOC 11 and I/O terminals of the IP 12 and other IPs, for achieving the function of the SOC 11 and (2) a test pattern or test patterns (with expected values of the outputs) for verifying the operation within the SOC 11 and the like.

On the other hand, the relating data of each of the IP 12 and other IPs includes (1) information describing respective I/O terminals and concrete actions for realizing its functions, (2) kind of the test facilitation method for use in testing whether or not a fault is contained in each of the IP 12 and other IPs (instances) and (3) test patterns (with expected values of the outputs) prepared according to that method.

The test facilitation method may include a conventional parallel access method and serial access method as well as the method described in the embodiments of the present invention. Information describing an operation of each IP 12 is basically of gate level net data or RTL net data. The gate level net data mentioned here is information about inputs/outputs of the IP 12 and connection between basic cells such as combinational logic gates and flip-flops or latches. The RTL net data is data about the functional action of the IP 12 described with register transfer level (RTL) description, which describes operation of logical combination (connection) and registers within the IP 12, using inputs/outputs of the IP12, registers (including flip-flops and latches) for use within the IP 12 and signals expressed in Boolean expression.

Hereinafter, as an example, description of multiplexer at gate level and RTL is shown.

| | |
|---|---|
| (gate level) | MUX21 Ixxx (.Z(data_out),. A0(data0),. A1(data1)., S(select)); |
| (RTL) | assign data_out = select ? data1: data0; |

The RTL net data can be converted to gate level net data by using a logic synthesizing tool. Although the net data of the SOC 11 is basically just connection data, it may be of gate level net data or RTL net data. The test facilitation circuit automatic insertion unit 53 automatically inserts a test facilitation circuit corresponding to a predetermined test facilitation method of each of the IPs (generally, plural) including the IP 12 into the SOC 11 based on the inputted relating data 51 of the SOC 11 and the relating data 52 of the IPs (generally plural) including the IP 12 used in the SOC 11. Then, circuit inserted relating information 54 of the SOC 11, comprised of the net data of the SOC 11 in which the test facilitation circuit is already inserted and a test pattern obtained by converting the IP test pattern so as to be capable of being used by the SOC 11 in which the test facilitation circuit is already inserted, is outputted.

Which is more preferable the gate level net or the RTL net will be described below. Recent SOCs are of large scale and demanded to have a high performance, and therefore, such timing restriction for operating lock frequency is very difficult to satisfy by human treatment. Recent logic synthesizing tools automatically executes operations internally such as finding a combination of optimum logic gates, increasing the size (drivability) of a buffer in a portion to satisfy the timing restriction and adding a new buffer.

Therefore, after the test facilitation circuit of the embodiment of the present invention is inserted, it is preferable that the timing restriction is satisfied by applying the logic-synthesizing tool. That is, basically, the net data of the SOC 11 and IPs including the IP 12 uses the RTL net data and it is preferred that the insertion of the test facilitation circuit according to the embodiment of the present invention is carried out with the RTL. However, the logic synthesizing tool creates the "preliminary" gate level net prior to the above-described various kinds of timing adjustments as a step prior to a final gate level net creation and this may be treated as net data. In this case, the logic synthesis does not have to be carried out each time thereby making it possible to reduce a development period. Meanwhile, although the SOC 11 may include so-called user defined logic (UDL) which realizes novel functions which have not been achieved in existing IPs as well as those existing IPs, the essential characteristic of the present invention which takes the IP 12 used in the SOC 11 as an object is not affected. On the other hand, the present invention may be applied by processing the UDL as an IP.

(Second Embodiment)

Figure 7:
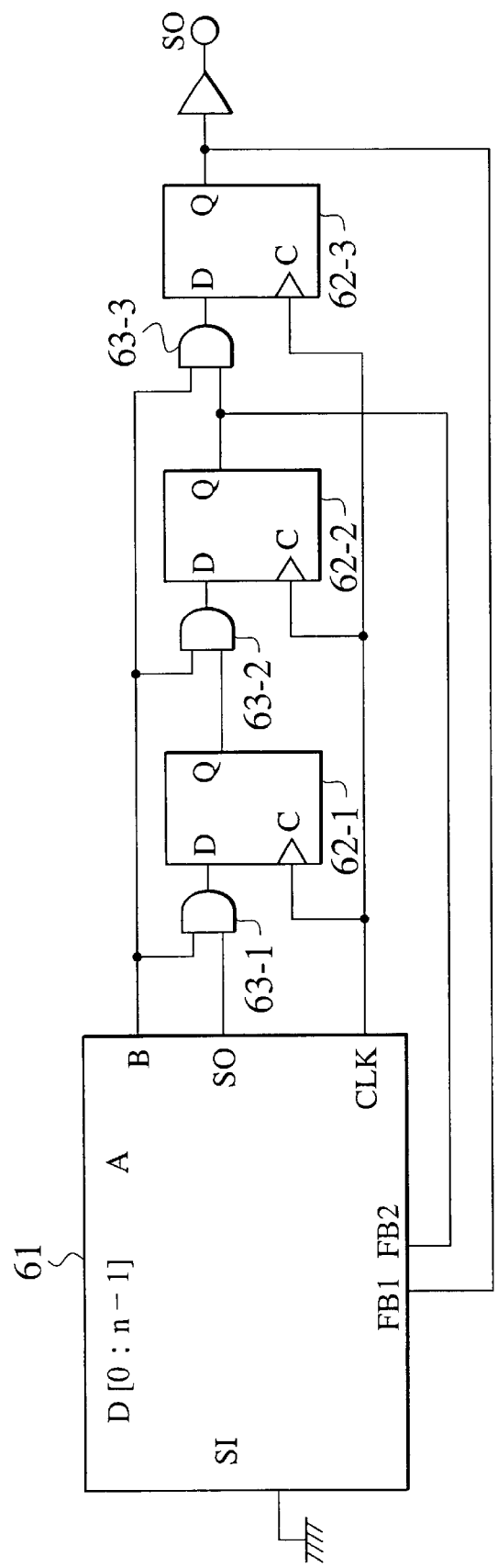
FIG. 7 is a circuit diagram showing the detailed structure of a test result storage circuit according to a second embodiment of the present invention.

FIG. 7 is a diagram showing a second embodiment of the test result storage circuit 15 shown in FIG. 2. A feature of the second embodiment is to relax dependency of reliability of signature compression result of test outputs from the IP 12, which has been described in the first embodiment, upon the number of bits of the F/F 41. In FIG. 7, a circuit block 61 indicates a generalized circuit equal to the circuit shown in FIG. 5 corresponding to the output number of the IP 12. In order to secure reliability of a signature compression result in the circuit block 61, AND gates 63-1 to 63-3 for directly connecting, for example, three signature compression F/F 62-1 to 62-3 to those F/F62s are provided. Outputs of the F/F 62-2 and the F/F 62-3 are inputted to the circuit block 61 as feedback signals. These inputs are subjected to exclusive OR with other feedback inputs in the circuit block 61 and provided as an input to the MUX 45 shown in FIG. 5. Operation under this structure is the same as that described in the first embodiment. The number of bits of F/Fs 62 to be added newly and the output of the F/F to be fed back are set up appropriately depending on the structure of the circuit block 61.

Though in the second embodiment, input SI has been grounded, the implement which deletes input SI as well as the first embodiment is also possible. The AND gates 63-1 to 63-3 in this implement are necessary in order to reset F/F 62-1 to 62-3. These AND gates are omissible, when it is reset by the different method.

According to the second embodiment, even if the number of bits of the outputs of the IP 12 which are test objects is small, the reliability of the signature compression of test data is secured, so that a fault in the IP 12 can be determined securely.

(Third Embodiment)

Figure 8:
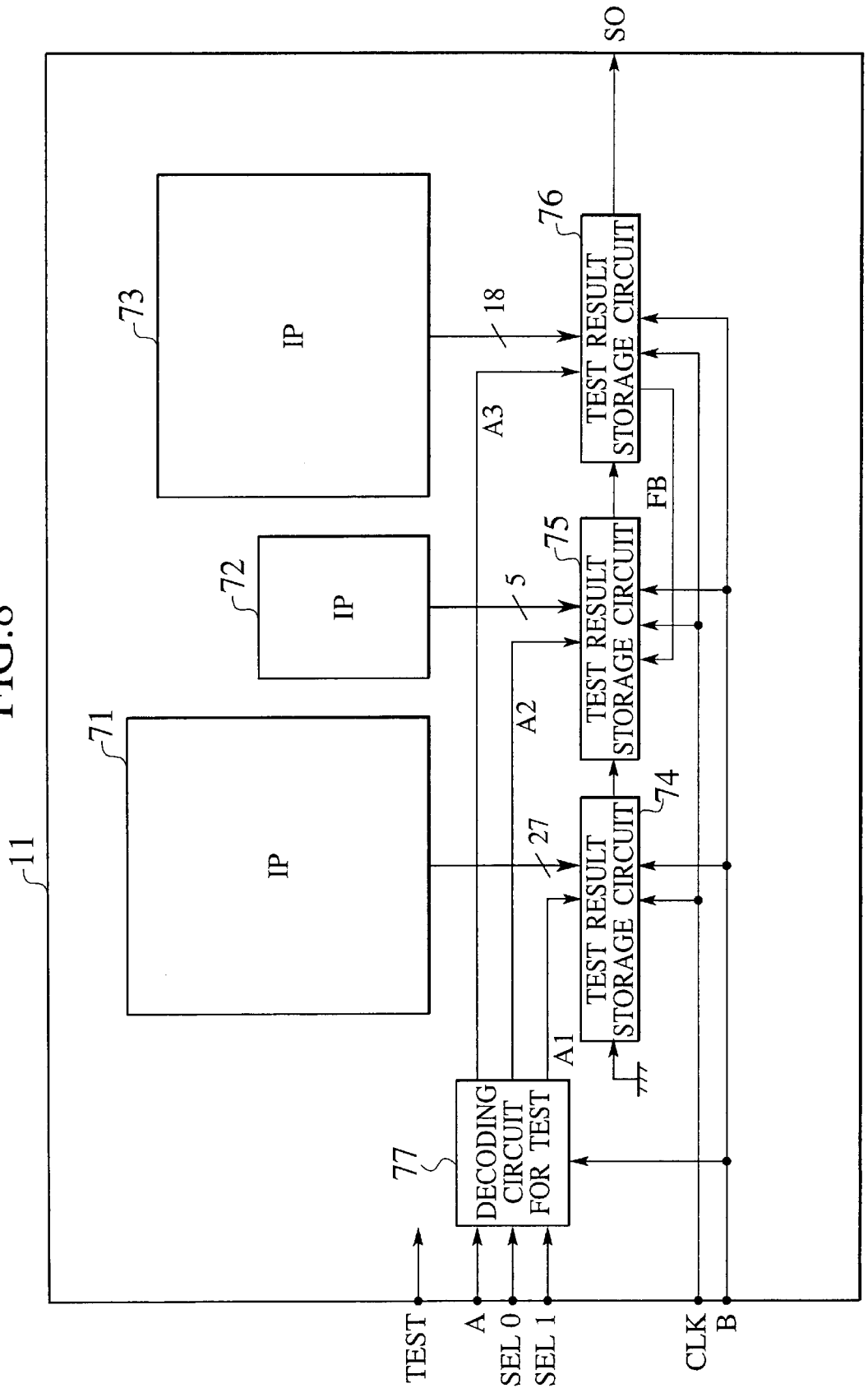
FIG. 8 is a block diagram showing the structure of a semiconductor integrated circuit according to a third embodiment of the present invention.

FIG. 8 is a diagram showing the structure of a semiconductor integrated circuit according to a third embodiment of the present invention. The semiconductor integrated circuit of the third embodiment includes plural IPs on which the present invention is applied. That is, the present invention is applied to three IPs 71, 72, 73 and corresponding to outputs thereof, test result storage circuits 74, 75, 76 each having signature compression function are added. Here, because the output number of the IP 71 is 27 bits, which is larger than 20 bits described previously, a corresponding test result storage circuit 74 should include a signature compression register of the same number of flip-flops (bit width) as the output number. Contrary to this, the output numbers of the IP 72 and IP 73 are 5 bits, 18 bits respectively, which are smaller than 20. Here, like the second embodiment shown in FIG. 7, it is permissible to provide a test result storage circuit including the signature compression register having little fear of aliasing by adding 16-bit, 3-bit flip-flops to the IP 72, 73. However, for ordinary operation of the SOC 11, a circuit added for test lead to increase of waste area.

According to the third embodiment, there is provided a test result storage circuit including a single signature compression register having 23-bit width in which test result storage circuits 75, 76 are coupled to the IPs 72, 73 respectively and a single flip-flop (bit) corresponds to each output of those IPs 72, 73. As a result, the problem of aliasing can be avoided and further, addition of a waste test circuit can be avoided. According to the third embodiment, with such a structure, a feedback signal from a predetermined bit position of the test result storage circuit 76 is inputted to the test result storage circuit 75.

A test decoding circuit 77 is a circuit for outputting selection signals for selecting the IPs 71, 72, 73 which is about to carry out a test. Signals A, B, SEL0, SEL1 are input signals while signals A1, A2, A3 are output signals. FIG. 9 shows a relation between the input signals and output signals and related operation. The signals SEL1, SEL0 are selection input signals for outputting signals A1, A2, A3 for selecting an IP about to carry out the signature compression action from three IPs 71, 72, 73, which are objects of the third embodiment. Generally, if N IPs exist, a number of the selection input signals equal to a maximum integer value smaller than $(1+\log_2 N)$.

With the above-described structure, if the number of input terminals and I/O terminals of the SOC 11 is sufficient, it is permissible not to use SEL1 by when for example, SEL0=0, testing the IP71 and the IP72 in parallel (signature compression) and when SEL0=1, testing the IP 73 (signature compression). Further, with the above structure, it is assumed that test data capture is carried out in the three IPs 71, 72, 73 at the same time, so that when A=1, B=0, it comes that A1=A2=A3=1. However, if data capture only has to be carried out for each of the IPs 71, 72, 73 individually, if it is so constructed that the input SEL1, SEL0 become valid when A=1, the necessity of inputting B to the test decoding circuit 77 is eliminated.

In the third embodiment, even if plural IPs exist in the SOC, the same effect as the first and second embodiments can be assured.

Figure 10:
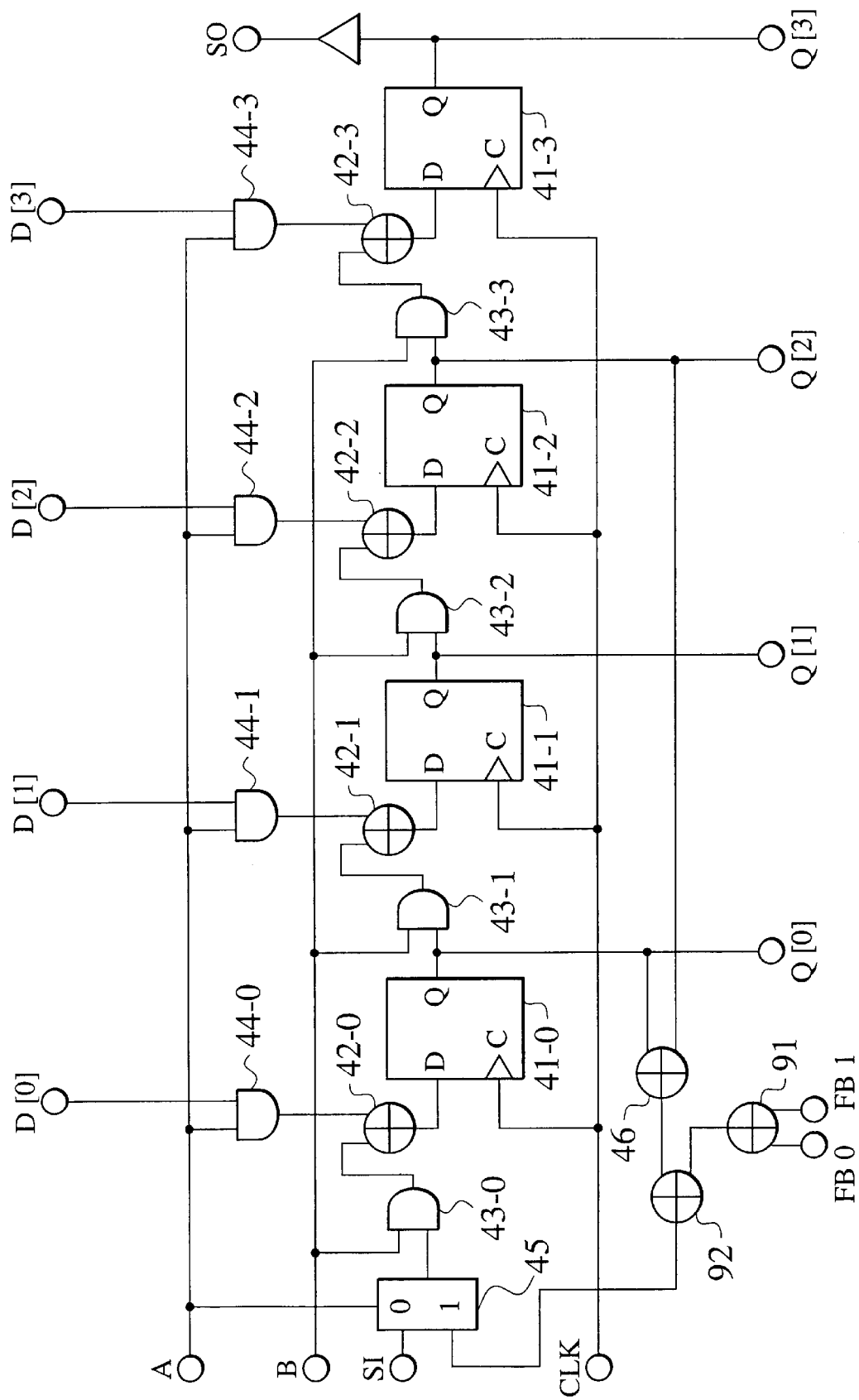
FIG. 10 is a circuit diagram showing the detailed structure of a test result storage circuit shown in FIG. 8.

FIG. 10 is a diagram showing a general structure of the test result storage circuit 75 shown in FIG. 8. The structure of FIG. 10 is expressed in a condition that its input is 4 bits so as to compare with the structure shown in FIG. 5. Further, its feedback position is indicated for convenience for explanation but does not correspond to a specific case. Predetermined feedback outputs FB0, FB1 are inputted from the other test result storage circuit 76 connected to the test result storage circuit 75 to an EX-OR gate 91. Exclusive OR gate 92 is inputted a feedback output of the test result storage circuit 75 and the EX-OR gate 91 and the output of the EX-OR gate 92 is inputted to one input of the multiplexer 45. The other basic operation is the same as that of the test result storage circuit shown in FIG. 5. Meanwhile, the test result storage circuits 76 except the test result storage circuit 75 have no multiplexer 45 in FIG. 5 and an output of the exclusive OR gate 46 becomes a feedback input to the test result storage circuit 75. It comes that a portion connected to an output terminal of the multiplexer 45 is connected directly to the SI. Further, in the test result storage circuit 74, the input terminal SI of the multiplexer 45, as shown in FIG. 5, is grounded. It is also possible that the multiplexer 45 is deleted and an output of the exclusive OR gate 46 is connected directly to the input of the AND gate 43-0.

If there is fear that aliasing occurs when the third embodiment is applied, it is permissible to add flip-flops necessary like the second embodiment shown in FIG. 7 or turn terminals corresponding to input D[i]s, not used for test, to "0" (grounding) in the structure shown in FIG. 5 or FIG. 10. Further, to achieve the third embodiment easily, it is also permissible to construct a test result storage circuit containing the signature compression register in the unit of appropriate bit counts, for example, 4 bits. If outputs of the object IPs are synchronous with plural clocks, it is permissible to prepare test result storage circuits for respective clock and then connect SO1, SO2, to output terminals of the SOC 11.

(Fourth Embodiment)

Figure 11:
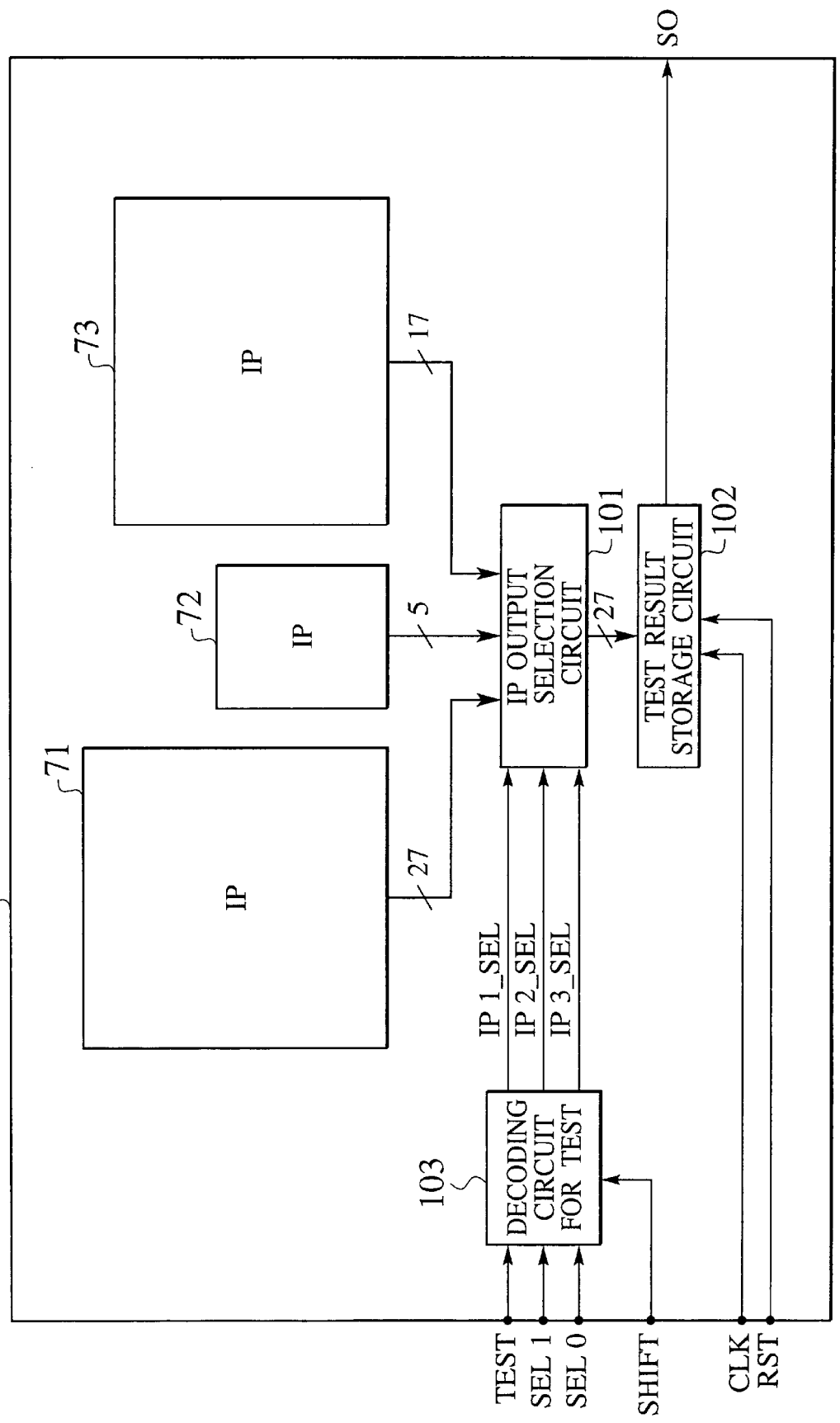
FIG. 11 is a block diagram showing the structure of a semiconductor integrated circuit according to a fourth embodiment of the present invention.

FIG. 11 is a diagram showing the structure of a semiconductor integrated circuit according to a fourth embodiment of the present invention. In the third embodiment shown in FIG. 8, test result storage circuits 74, 75, 76 are provided corresponding to each of the IPs 71, 72, 73. Thus, an amount of the test circuit increases corresponding to the number of the IPs which are object of the present invention (proportional to a total output number of the object IPs). Moreover, since the feedback position is changed corresponding to the output number of the object IPs, development of a tool (program) for achieving this point becomes complicated. The fourth embodiment of the present invention is achieved by improving these points and comprises an IP output selection circuit 101 for selecting outputs of the IPs 71, 72, 73, a test result storage circuit 102 including a signature compression register for signature compressing the outputs of the IPs 71, 72, 73 selected by the IP output selection circuit 101 and a test decoding circuit 103 for controlling selection of the IP output selection circuit 101.

Figure 12:
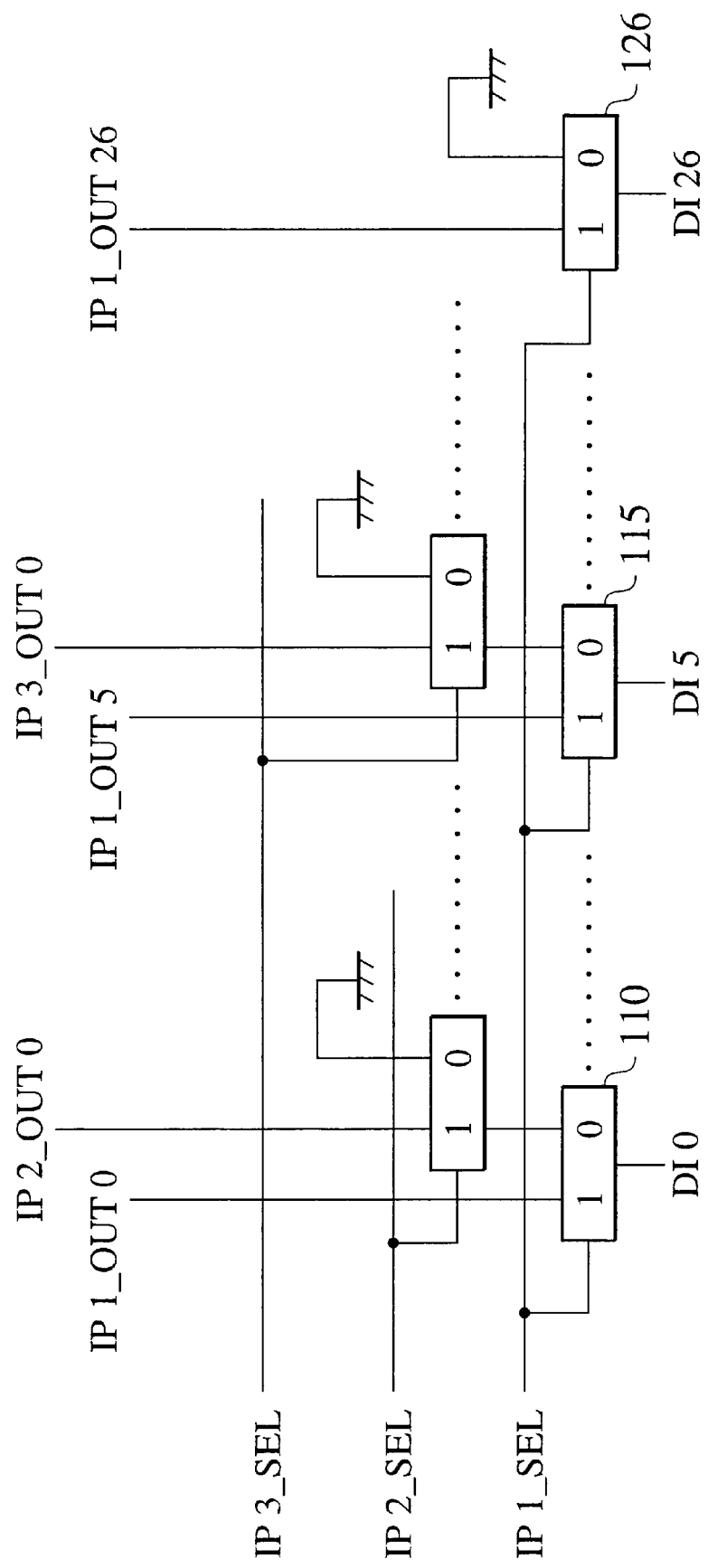
FIG. 12 is a block diagram showing the detailed structure of an IP output selection portion shown in FIG. 11.

FIG. 12 shows an example of the structure of an IP output selection circuit 101 comprising the multiplexers (MUX). In FIG. 12, output IP1_OUT0 to OUT26 of the IP 71, output IP2_OUT0 to IP2_OUT4 of the IP 72 and output IP3_OUT0 to IP3_OUT16 of the IP73 and IP selection outputs IP1_SEL, IP2_SEL, IP3_SEL of a test decoding circuit 103 are inputted and then, outputs DI0 to DI26 (input to the test result storage portion 102) of 27 bits corresponding to the number of outputs of the IP 71, which is a maximum output number, among those of the IPs 71, 72, 73, are outputted from the MUX 110, MUX115, MUX126. In FIG. 12, as a portion relating to input from the IP2 and IP3, only portions about bit 0 are expressed for simplification of the description. Each of multiplexers is connected in such a cascade manner that input from the "0" side is connected to output from different IP or (if there is no IP output which should be connected) "0" (grounded), and only one of the IP1_SEL, IP2_SEL, IP3_SEL turns to 1 or all turn to 0.

Figure 13:
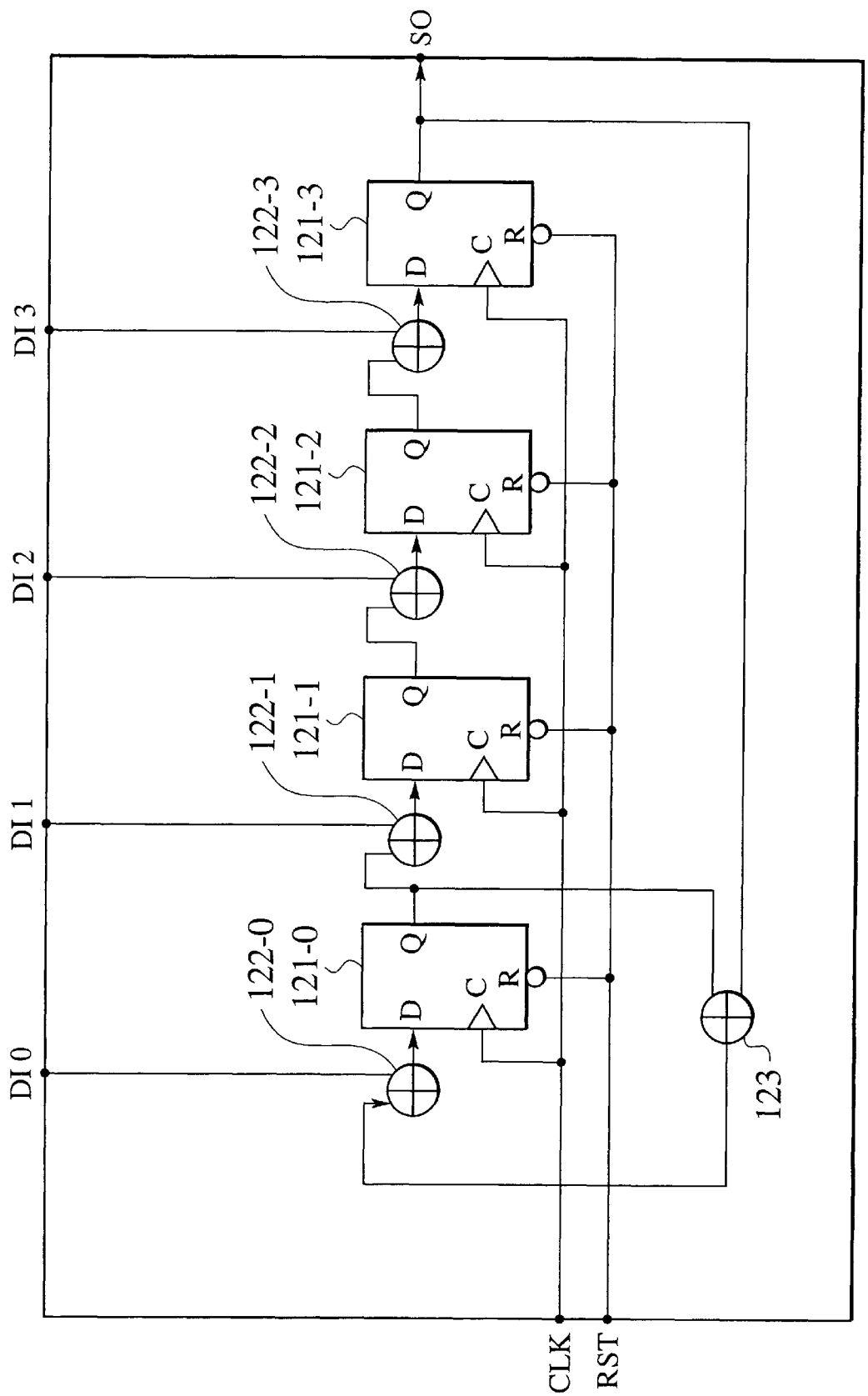
FIG. 13 is a circuit diagram showing the detailed structure of the test result storage circuit shown in FIG. 11.

FIG. 13 is a diagram showing a general structure of the test result storage circuit 102. The structure shown in FIG. 13 is expressed with the input as 4 bits so as to compared with the structure shown in FIG. 5. Further, the feedback positions are set up only for convenience of explanation but does not correspond to a specific case. In the structure shown in FIG. 13, flip-flops 121-0 to 121-3 with asynchronous reset (low active) are employed. These flip-flops 121 receive outputs of corresponding EX-OR gates 122-0 to 122-3 as their inputs and feedback through an EX-OR gate 123. Further, because control input for shift operation is provided by the IP output selection circuit 101 and the test decoding circuit 103, the circuit of FIG. 12 is constructed of substantially only a signature compression register portion. FIG. 14 shows an operation of the entire circuit. In the operation shown in FIG. 14, test data capture is enabled at a first cycle after reset is released.

The IP selection output portion 101 of the fourth embodiment may be achieved using 3-state buffers and bus instead of the multiplexer. For an excess bit (bit to which any output from the IPs 71, 72, 73 is not connected) which may occur when the test result storage circuit is constructed in the unit of an appropriate bits which is larger than 1, an appropriate DI input of the test result storage circuit 102 may be connected to "0" (grounded). Further, the entire test result storage circuit may be achieved by combining the third embodiment shown in FIG. 8 and the fourth embodiment. That is, in this case, as for connection between the IP output selection circuit 101 and the test result storage circuit 102 in FIG. 11, the test result storage circuit 102 is connected in such a style that the test result storage circuit 74 is connected to the test result storage circuits 75, 76.

According to the fourth embodiment, the same effect as the first to third embodiments can be obtained and even if the number of the IPs increases, the structure can be reduced in size without large increase of the amount of the test result storage circuits.

As described above, according to the first to fourth embodiments, the test results of the function blocks or IPs (IP: intellectual property) are taken out of the semiconductor integrated circuit through the test result storage circuit which signature-compresses test outputs of the functional blocks (IPs). As a result, tests on the IPs according to the MUX insertion method are enabled without depending on the number of the external terminals of the semiconductor integrated circuit, thereby suppressing enlargement of the structure necessary for the tests and reducing time required for the tests.

Additional advantages and modifications will readily occur to those skilled in the art. Therefore, the invention in its broader aspects is not limited to the specific details and representative embodiments shown and described herein. Accordingly, various modifications may be made without departing form the spirit or scope of the general inventive concept as defined by the appended claims and their equivalents.

What is claimed is:

1. A semiconductor integrated circuit comprising:
   a selection circuit which selects any one of plural inputs;
   a bi-directional selection circuit which exchanges data bi-directionally;
   a plurality of functional blocks, each including an input terminal connected to an output terminal of one other functional block and an input terminal of the semiconductor integrated circuit through the selection circuit, and a bi-directional terminal connected to a bi-directional terminal of the other functional block and a bi-directional terminal of the semiconductor integrated circuit through the bi-directional selection circuit;
   a plurality of test result storage circuits which function as test facilitation circuits, wherein the plurality of test result storage circuits are connected to output terminals of the plurality of functional blocks, receive n bits of test results of in parallel from the functional blocks, simultaneously signature-compress the test results, and output the signature-compressed data from an output terminal of the semiconductor integrated circuit in a unit of m bits, wherein m is smaller than n, and
   a decoding circuit which selects a functional block to be tested from the plurality of functional blocks.

2. The semiconductor integrated circuit of claim 1, wherein the plurality of test result storage circuits receive the n bits of test results in parallel from the plurality of functional blocks and output the test results serially from the output terminals of the semiconductor integrated circuit in parallel in the unit of m bits.

3. The semiconductor integrated circuit of claim 1, wherein the plurality of test result storage circuits are connected in series, and the plurality of test result storage circuits receive the n bits of test results in parallel from the plurality of functional blocks, signature-compress the test results, and output the test results signature-compressed in series from the output terminals of the semiconductor integrated circuit in the unit of m bits, through an output terminal of a test result storage circuit located at a final stage of the plurality of result storage circuits connected in series.

4. The semiconductor integrated circuit of claim 1, wherein the plurality of test result storage circuits are connected in series, and the plurality of test result storage circuits receive the n bits of test results in parallel from the plurality of functional blocks, and output the test results serially from the output terminals of the semiconductor integrated circuit in the unit of m bits, through an output terminal of a test result storage circuit located at a final stage of the plurality of test result storage circuits connected in series.

5. The semiconductor integrated circuit of claim 1 further comprising an output selection circuit which selects output terminals of the plurality of functional blocks, wherein the decoding circuit controls a selection operation of the output selection circuit and the plurality of test result storage circuits receive a test result of a functional block selected by the output selection circuit.

6. The semiconductor integrated circuit of claim 5, wherein the output selection circuit includes a plurality of multiplexers connected in a cascade manner.

7. The semiconductor integrated circuit of claim 5, wherein the plurality of test result storage circuits include a plurality of flip-flop circuits having asynchronous reset function.

8. The semiconductor integrated circuit of claim 1, wherein the selection circuit includes a plurality of multiplexers provided in parallel.

9. The semiconductor integrated circuit of claim 1 wherein:
the bi-directional selection circuit comprises a common wire and a plurality of connection nodes disposed on the common wire;
the other functional block, the bi-directional terminal of the semiconductor integrated circuit and the plurality of functional blocks each comprise a 3-state buffer connected to the plurality of connection nodes.

10. An automatic insertion method for inserting a test facilitation circuit into a semiconductor integrated circuit constructed by connecting a plurality of functional blocks to each other, the automatic insertion method comprising:
inputting first relating data of the semiconductor integrated circuit and second relating data of the plurality of functional blocks, wherein
the first relating data include data related to input/output terminals of the semiconductor integrated circuit, data related to input/output terminals available for test for the plurality of functional blocks, first net data indicating a connection between input/output terminals of the semiconductor integrated circuit and input/output terminals of the plurality of functional blocks for realizing a function of the semiconductor integrated circuit, and first test pattern data confirming operation of the semiconductor integrated circuit, and
the second relating data include information describing an operation realizing function of the plurality of functional blocks, the kind of automatic insertion method for testing whether or not there is a fault, and test patterns prepared for the automatic insertion method;
inserting a plurality of test result storage circuits functioning as the test facilitation circuit for the plurality of functional blocks into the semiconductor integrated circuit; and
outputting third relating data including second net data of the semiconductor integrated circuit, and second test pattern data confirming operation of the semiconductor integrated circuit, wherein the plurality of test result storage circuits receive n bits of test results in parallel from the plurality of functional blocks, simultaneously signature-compress the test results, and output the signature-compressed data from an output terminal of the semiconductor integrated circuit in a unit of m bits, wherein m is smaller than n.

11. The automatic insertion method of claim 10, wherein the plurality of test result storage circuits are connected in series, and the plurality of test result storage circuits receive the n bits of test results in parallel from the plurality of functional blocks, signature-compress the test results, and output the test results signature-compressed in series from output terminals of the semiconductor integrated circuit in the unit of m bits, through an output terminal of a test result storage circuit located at a final stage of the plural test result storage circuits connected in series; and wherein the automatic insertion method further comprises selecting a functional block to be tested from the plurality of functional blocks though a decoding circuit.

12. The automatic insertion method of claim 10, wherein inserting the plurality of test result storage circuits into the semiconductor integrated circuit comprises:
inserting an output selection circuit for selecting output terminals of the plurality of functional blocks and a decoding circuit for controlling a selection operation of the output selection circuit, wherein the plurality of test result storage circuits receive the test results of a functional block selected by the output selection circuit.

13. The automatic insertion method of claim 10 wherein the information describing the operation realizing function of the plurality of functional blocks comprises:
an RTL net data describing operation by a logical combination and registers inside the plurality of functional blocks by using inputs/outputs of the plurality of functional blocks, registers for use inside the plurality of functional blocks, and signals expressed according to a Boolean expression.

14. The automatic insertion method of claim 10, wherein the information describing operation realizing function of the plurality of functional blocks comprises:
gate level net data including connection information between basic cells in the plurality of functional blocks and input/output terminals of the plurality of functional blocks.

* * * * *